(12) United States Patent
Hwang

(10) Patent No.: US 7,557,038 B2
(45) Date of Patent: Jul. 7, 2009

(54) METHOD FOR FABRICATING SELF-ALIGNED CONTACT HOLE

(75) Inventor: Han Gyoo Hwang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 290 days.

(21) Appl. No.: 11/318,095

(22) Filed: Dec. 22, 2005

(65) Prior Publication Data

US 2006/0160356 A1 Jul. 20, 2006

(30) Foreign Application Priority Data

Dec. 23, 2004 (KR) .................. 10-2004-0111049

(51) Int. Cl.
*H01L 21/44* (2006.01)
(52) U.S. Cl. .................. 438/672; 257/E21.507
(58) Field of Classification Search .................. 438/586, 438/597, 618, 639, 675, 700, 672
See application file for complete search history.

(56) References Cited

U.S. PATENT DOCUMENTS

| 4,466,172 A | 8/1984 | Batra |
| 4,517,729 A | 5/1985 | Batra |
| 5,861,676 A | 1/1999 | Yen |
| 6,348,411 B1 * | 2/2002 | Ireland et al. ............ 438/672 |
| 6,399,512 B1 | 6/2002 | Blosse et al. |
| 6,635,566 B1 | 10/2003 | Blosse et al. |
| 6,764,957 B2 | 7/2004 | Yu |
| 2002/0029900 A1 * | 3/2002 | Wimberger Friedl et al. ..... 174/258 |
| 2004/0121580 A1 | 6/2004 | Lee |

FOREIGN PATENT DOCUMENTS

JP 04096331 A * 3/1992

* cited by examiner

*Primary Examiner*—W. David Coleman
*Assistant Examiner*—Sonya D McCall-Shepard
(74) *Attorney, Agent, or Firm*—The Law Offices of Andrew D. Fortney; Andrew D. Fortney

(57) ABSTRACT

Disclosed are: (i) a method for fabricating self-aligned contact hole in a semiconductor device, and (ii) a semiconductor device having a self-aligned contact. The method comprises the steps of: (a) forming an oxide layer covering a gate structure on a semiconductor substrate, the gate structure including a gate oxide pattern, a gate electrode pattern, a hard-mask nitride pattern, and a spacer nitride on sidewalls thereof; (b) forming a mask pattern on the oxide layer; (c) forming a contact trench by removing a portion of the oxide layer, exposed by the mask pattern, to a predetermined depth; (d) forming a buffer layer on the oxide layer, including in the contact trench; (e) etching a portion of the buffer layer at a bottom of the contact trench to expose a portion of the oxide layer; and (f) forming a contact hole by etching the exposed oxide layer using a remaining buffer layer as an etching mask.

12 Claims, 2 Drawing Sheets

METHOD FOR FABRICATING SELF-ALIGNED CONTACT HOLE

This application claims the benefit of Korean Application No. 10-2004-0111049, filed on Dec. 23, 2004, which is incorporated by reference herein in its entirety.

BACKGROUND OF THE INVENTION

1. Field of the Invention

The present invention relates to a semiconductor device and a method for fabricating the same. More specifically, the present invention relates to a method for fabricating a self-aligned contact hole in a semiconductor device.

2. Description of the Related Art

As integration of semiconductor devices has increased, multilevel-interconnection has become an indispensable technology for manufacturing semiconductor devices. In multilevel-interconnection, a variety and/or plurality of miniaturized wiring patterns at different levels of the device generally overlap with each other on a plurality of dielectric layers. However, conventional photolithography technologies can sometimes fail to obtain sufficient accuracy for overlapping the variety of patterns with each other on a semiconductor substrate. Because of such limitations of conventional photolithography technologies, a short circuit between conductive layers can occur during the process of forming a contact.

In order to solve the aforementioned problem, a self-aligned contact technology for forming a contact hole using an etching selectivity and topology of dielectric layers (such as silicon [di]oxide and silicon nitride) has been developed, which is briefly described hereinafter.

First, an intermetal dielectric oxide layer is deposited on a semiconductor substrate where a gate structure has been formed in advance. Then, a photoresist pattern is formed on the intermetal dielectric oxide layer by a photolithography process. The gate structure comprises a gate oxide pattern, a gate electrode pattern, a hard-mask nitride pattern, and a nitride spacer on the sidewalls thereof. After the photoresist pattern is formed, a contact hole is formed by dry etching the intermetal dielectric oxide layer using the photoresist pattern as an etching mask, thus exposing the spacer nitride pattern and a portion of the substrate. Subsequently, the photoresist pattern is removed and the contact hole is filled with a conductive material, e.g., metals. Afterward, a portion of the conductive material formed on the intermetal dielectric oxide layer (outside the contact hole) is removed or planarized so that the self-aligned contact including a contact plug is completed.

However, in the above conventional method for forming a self-aligned contact hole, an area of the substrate exposed by the contact hole can decrease because polymers (potentially a relatively large quantity) may disturb the etching process for forming the contact hole. The polymers can occur when the spacer nitride pattern is exposed during the dry etching. Then, an etching rate of the intermetal dielectric oxide in a bottom of the contact hole becomes conspicuously decreased, compared to that of the intermetal dielectric oxide in a top of the contact hole. In case of over-etching the intermetal dielectric oxide (e.g., in order to obtain a sufficient etching rate in the bottom of the contact hole), the etching selectivity of the oxide (i.e., the intermetal dielectric oxide layer) to the nitride (i.e., the spacer nitride pattern) may decrease. In this case, the nitride as well as the oxide can be etched so that the gate electrode pattern can be damaged. In addition, increasing a thickness of the hard-mask nitride pattern for protecting the gate electrode pattern may result in increase of the aspect ratio of the contact hole.

SUMMARY OF T INVENTION

It is, therefore, an object of the present invention to provide a method for fabricating a self-aligned contact hole in a semiconductor device, wherein an etching selectivity of an oxide to a nitride is improved so that an oxide layer can be effectively etched during the etching process for forming a self-aligned contact hole.

Another object of the present invention is to provide a method for fabricating a self-aligned contact hole in a semiconductor device, which enables increase of an overlap margin for a self-aligned contact in the semiconductor device.

It is still another object of the present invention to provide a semiconductor device having a sufficient overlap margin for a self-aligned contact.

To achieve the above objects, an embodiment of a method for fabricating self-aligned contact hole in a semiconductor device, according to the present invention, comprises the steps of: (a) forming an oxide layer covering a gate structure on a semiconductor substrate, the gate structure including a gate oxide pattern, a gate electrode pattern, a hard-mask nitride pattern, and a spacer nitride on sidewalls thereof; (b) forming a mask pattern on the intermetal dielectric oxide layer; (c) forming a contact trench by removing a portion of the oxide layer exposed by the mask pattern to a predetermined depth; (d) forming a buffer (e.g., PE-SiN) layer on the oxide layer including in the contact trench; (e) etching a portion of the buffer layer on a bottom of the contact trench to expose a portion of the oxide layer; and (f) forming a contact hole by etching the exposed portion of the oxide layer using a remaining buffer layer as an etching mask.

Here, the contact trench preferably does not expose the gate structure during step (c). Especially, the contact trench in step (c) may not expose the hard-mask nitride pattern and/or the spacer nitride. Furthermore, a contact plug can be formed by filling the contact hole with a conductive material.

In addition, a semiconductor device according to the present invention comprises: a plurality of gate structures on a semiconductor substrate, each gate structure including a gate oxide pattern, a gate electrode pattern, a hard-mask nitride pattern and a spacer nitride; an oxide layer covering the plurality of gate structures; a contact trench having a predetermined depth in the oxide layer over a source/drain terminal between adjacent gate structures; and a contact hole from the contact trench to a surface of the substrate between the adjacent gate structures.

Furthermore, the semiconductor device can further comprise a contact plug comprising a conductive material filling the contact hole.

These and other aspects of the present invention will become evident by reference to the following description of the invention, often referring to the accompanying drawings.

DETAILED DESCRIPTION OF THE INVENTION

FIGS. 1 to 4 are cross-sectional views of a semiconductor device, illustrating an embodiment of a method for fabricating a self-aligned contact hole in a semiconductor device according to the present invention.

Figure 1:
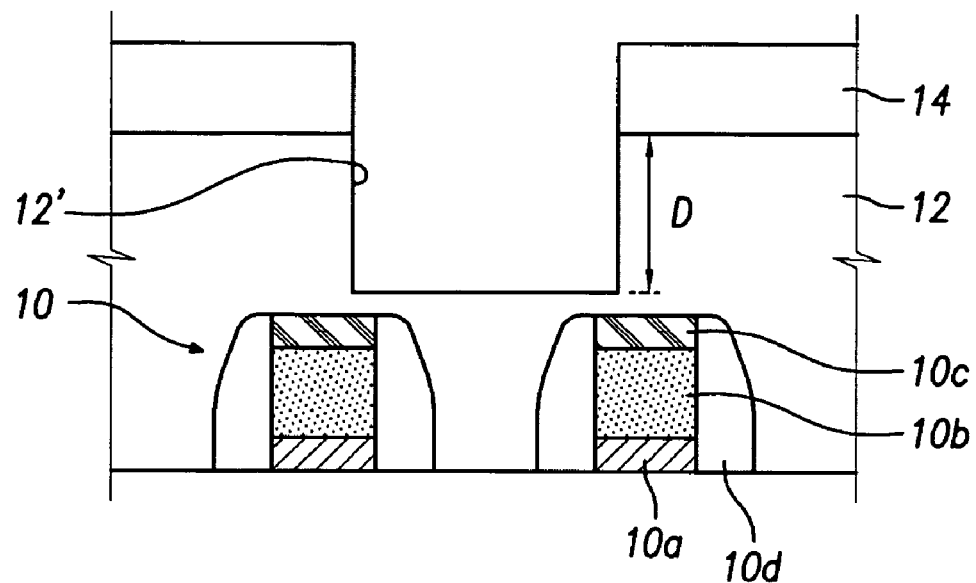
FIGS. 1 to 4 are cross-sectional views of a semiconductor device, illustrating an embodiment of a method for fabricating a self-aligned contact hole in a semiconductor device according to the present invention.

First, as shown in FIG. 1, a gate structure 10 is formed on a semiconductor substrate (not shown). Here, the gate structure 10 can be formed in such a manner known to those skilled in the art. Namely, a gate oxide layer, a gate electrode layer (e.g., a polysilicon layer), and a hard-mask nitride layer are formed in successive order. Then, these layers are patterned by a photolithography and etching processes so that a gate oxide pattern 10a, a gate electrode pattern 10b, and a hard-mask nitride pattern 10c are formed. Thereafter, another nitride layer (not shown) is deposited on the substrate and gate structures 10, then anisotropically etched (e.g., by dry and/or plasma etching) to form a nitride spacer 10d on sidewalls of the patterns 10a, 10b, and 10c.

After the gate structure 10 is completed, a dielectric oxide layer 12 is deposited on the substrate, and a mask pattern 14 (comprising a conventional photoresist material, patterned by conventional photolithography) having an opening for a contact trench is then formed on an upper surface of the intermetal dielectric oxide layer 12. The width of the opening in mask pattern 14 is relatively large compared to a conventional non-self-aligned contact. For example, if a so-called conventional "poly contact" hole (i.e., for making contacts to structures at the level of the polysilicon gates) has a dimension of x nm, then the opening in mask pattern 14 is generally from 1.5x to 2.5x. The oxide layer 12 preferably comprises a polysilicon-metal dielectric (e.g., an oxide and/or nitride of silicon and/or a metal, such as silicon dioxide [which may be doped with one or more dopants such as F, B and/or P], a silicon-rich oxide [e.g., having a formula $SiO_y$, where $1<y<2$], etc.) or a premetal dielectric (e.g., a nitride/oxide stack, such as silicon nitride/silicon dioxide doped with B and/or P/undoped silicon dioxide). In addition, the mask pattern 14 is formed by applying a photoresist in a predetermined thickness on the intermetal dielectric oxide layer 12 and patterning it using a typical photolithography process. The mask pattern 14 exposes a portion of the dielectric oxide layer 12, especially where a contact hole is to be formed.

Subsequently, the exposed portion of the intermetal dielectric oxide layer 12 is removed to a desired depth by partial etching process using the mask pattern 14 as an etching mask, so that a contact trench 12' having a predetermined depth D is formed. The contact trench 12' is formed over a region of the substrate (generally a source/drain terminal) between adjacent gate structures 10. The contact trench 12' preferably has a depth that does not expose the hard-mask nitride pattern 10c that is the uppermost layer of the gate structure 10. In addition, the contact trench 12' preferably has a depth that does not expose the nitride spacer 10d of the gate structure 10.

Figure 2:
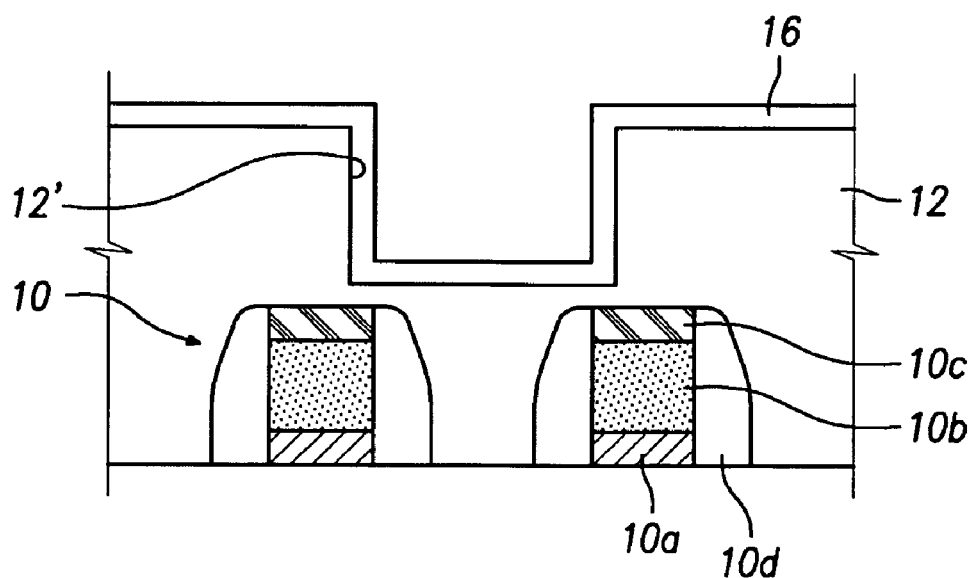

Referring to FIG. 2, the mask pattern 14 is removed, and a buffer layer 16 (e.g., comprising PE-SiN [or a polyethylene-silicon nitride composite material], a polyethylene oxide, etc.) is then formed on the dielectric oxide layer 12 in which the contact trench 12' is formed. Preferably, the buffer layer 16 has a poor step coverage property so that it is mainly deposited on sidewalls of the contact trench 12' and an upper surface of the dielectric oxide layer 12, rather than on a bottom of the contact trench 12'. The PE-SiN layer 16 may be formed by plasma enhanced chemical vapor deposition (PECVD), and is known to have acceptably poor step coverage when deposited in this manner. Polyethylene oxide polymers are believed to show similar step coverage characteristics.

Figure 3:
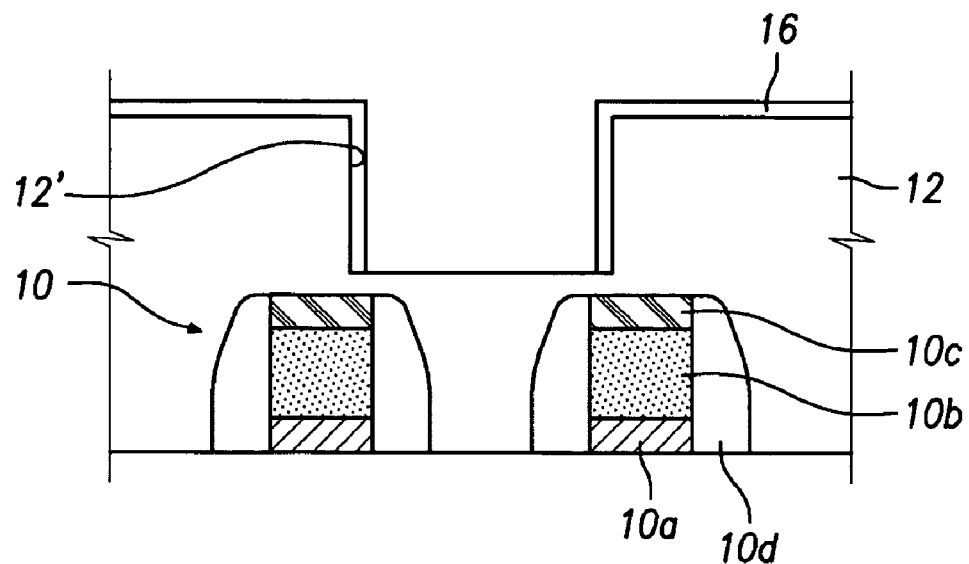

Next, as shown in FIG. 3, an etching process is performed until a portion of the PE-SiN layer 16 formed on the bottom of the contact trench 12' is completely removed. Here, because the PE-SiN layer 16 is deposited relatively thick on the sidewalls of the contact trench 12' and the upper surface of the intermetal dielectric oxide layer 12, portions of the PE-SiN layer 16 thereon can remain during (and possibly after) the aforementioned etching process. Accordingly, only a portion of the dielectric oxide layer 12 at the bottom of the contact trench 12' is generally exposed. In addition, the remaining portions of the PE-SiN layer 16 have an effect on increasing the etching selectivity of the oxide and the nitride in a subsequent etching process, because the exposed area of a nitride increases. As a result, the PE-SiN layer 16 can be used as an etching mask in the subsequent etching process for forming a contact hole.

Figure 4:
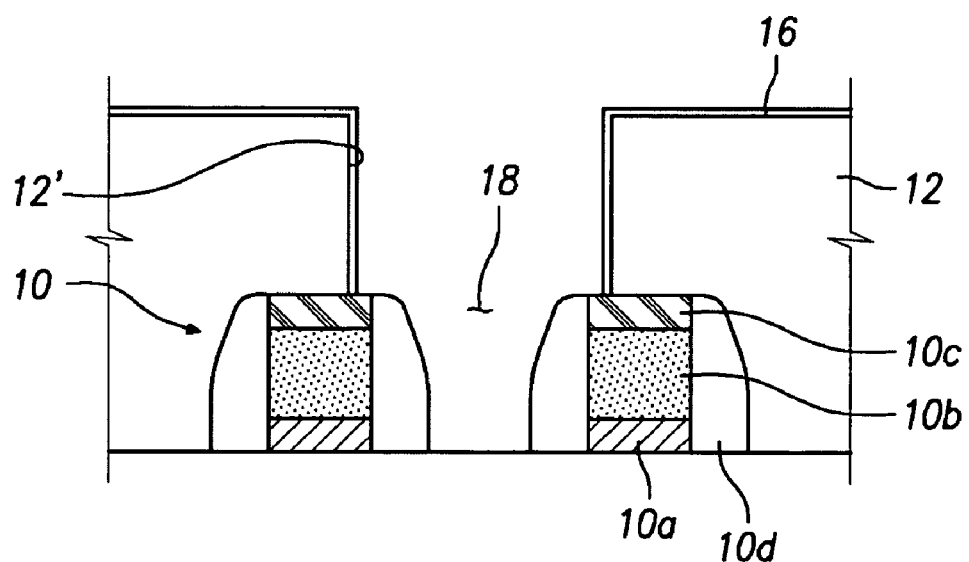

As shown in FIG. 4, the exposed portion of the dielectric oxide layer 12 is removed by etching, using the remaining PE-SiN layer 16 as an etching mask, so that a contact hole 18 extending from the contact trench 12' to the substrate is formed.

After the formation of the contact hole 18, the remaining PE-SiN layer 16 may be removed, and the contact hole 18 is then filled with a conductive material (e.g., one or more conductors and/or metals). Typically, the conductive material comprises an adhesive liner (e.g., a thin Ti layer), a diffusion barrier (e.g., a thin TiN or TiW alloy layer), and a bulk contact (e.g., W deposited by conventional CVD or Al deposited by sputtering). A portion of the conductive material formed on the intermetal dielectric oxide layer 12 is removed or planarized (e.g., by etch back or chemical mechanical polishing) so that a contact plug (not shown) is formed in the contact hole 18. Furthermore, a metal wiring layer, for example comprising a lower adhesive liner (e.g., a thin Ti layer), a diffusion barrier (e.g., a thin TiN or TiW alloy layer), a bulk conductor (e.g., Al or Al—Cu alloy deposited by sputtering), an upper adhesive liner (e.g., a second thin Ti layer), and a diffusion barrier and/or anti-reflective coating (e.g., a second thin TiN or TiW alloy layer) can be formed on the dielectric oxide layer 12.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a self-aligned contact hole in a semiconductor device, comprising the steps of:
   (a) forming an oxide layer covering a gate structure on a semiconductor substrate, the gate structure including a gate oxide pattern, a gate electrode pattern, a hard-mask nitride pattern, and a spacer nitride on sidewalls thereof;
   (b) forming a mask pattern on the oxide layer;
   (c) forming a contact trench by removing a portion of the exposed oxide layer to a predetermined depth, wherein the predetermined depth of the contact trench is less than a total thickness of the oxide layer;
   (d) forming a buffer layer by plasma enhanced chemical vapor deposition (PECVD) on the oxide layer including in the contact trench;
   (e) etching the buffer layer such that portions of the buffer layer remain on an upper horizontal surfaces of the oxide layer and sidewalls of the contact trench, and an entire portion of the buffer layer at a bottom of the contact trench is removed to expose a portion of the oxide layer; and
   (f) forming the self-aligned contact hole by etching the exposed portion of the oxide layer using the remaining portions of the buffer layer as an etching mask to expose portions of the hard-mask nitride pattern, the spacer nitride, and the substrate, wherein the exposed portions of the hard-mask nitride pattern are in contact with the remaining portions of the buffer layer.

2. The method of claim 1, wherein the contact trench does not expose the gate structure.

3. The method of claim 2, wherein the contact trench does not expose the hard-mask nitride pattern of the gate structure.

4. The method of claim 2, wherein the contact trench does not expose the spacer nitride.

5. The method of claim 1, wherein the method further comprises the step of forming a contact plug by filling the contact hole with a conductive material.

6. The method of claim 1, wherein the contact trench is formed over a region of the substrate between adjacent gate structures.

7. The method of claim 1, wherein forming the buffer layer comprises depositing a relatively thick buffer layer on the sidewalls of the contact trench and the upper surface of the oxide layer.

8. The method of claim 1, wherein the buffer layer comprises a polyethylene-silicon nitride composite material.

9. The method of claim 1, wherein the buffer layer comprises a polyethylene oxide composite material.

10. The method of claim 8, wherein the polyethylene-silicon nitride composite material has poor step coverage.

11. The method of claim 9, wherein the polyethylene oxide composite material has poor step coverage.

12. The method of claim 1, wherein the contact hole extends from the contact trench to the substrate.

* * * * *